United States Patent [19]
Debaty

[11] Patent Number: 5,939,917
[45] Date of Patent: Aug. 17, 1999

[54] VOLTAGE-CONTROLLED PHASE SHIFTER

[75] Inventor: Pascal Debaty, Domene, France

[73] Assignee: SGS-Thomson Microelectronics S.A., Saint Genis, France

[21] Appl. No.: 08/979,925

[22] Filed: Nov. 26, 1997

[30] Foreign Application Priority Data

Nov. 29, 1996 [FR] France .................................. 96 14900

[51] Int. Cl.⁶ .................................................. H03F 3/45
[52] U.S. Cl. ........................ 327/246; 327/251; 327/252; 327/237; 327/234
[58] Field of Search .................................... 327/251, 252, 327/246, 247, 231, 232, 234, 237, 356, 359

[56] References Cited

U.S. PATENT DOCUMENTS

| 4,058,771 | 11/1977 | Ohsawa | 327/113 |
| 4,617,523 | 10/1986 | Taylor | 330/260 |
| 4,663,594 | 5/1987 | Perkins | 327/240 |

FOREIGN PATENT DOCUMENTS 43 27 619  2/1995  Germany .......................... H03H 7/18

OTHER PUBLICATIONS

French Preliminary Search Report from 9614900, filed Nov. 29, 1996.

*Ein Integrierte Synchrondemodulatorkombination für Farbfernsehempfänger*, Pech, Valvo Berichte, vol. 18, No. 1/02, Apr. 1994, pp. 15–28.

*Primary Examiner*—Timothy P. Callahan
*Assistant Examiner*—April Giles
*Attorney, Agent, or Firm*—Wolf, Greenfield & Sacks, P.C.

[57] ABSTRACT

The present invention relates to a voltage-controlled phase shifter including two differential stages, each including a biasing branch and output branches coupled with the output branches of the other stage; two first resistors coupling the output branches to a first supply potential; a first capacitor connected between the output branches; two second resistors connected in series between the biasing branches; a second capacitor connected in series between the two second resistors; means for applying an input signal in the form of a differential current across the second capacitor; and means for supplying, as an output signal, the sum of the current in one of the first resistors and of a predetermined fraction of a corresponding component of the differential current constituting the input signal.

32 Claims, 4 Drawing Sheets

VOLTAGE-CONTROLLED PHASE SHIFTER

BACKGROUND OF THE INVENTION

1. Field of the Invention

The present invention relates to a voltage-controlled phase shifter, that is, to a circuit that enables shifting of the phase of an input signal by a value determined by a control voltage. The present invention also relates to application of such a phase shifter to a voltage-controlled quartz oscillator.

2. Discussion of the Related Art

FIG. 1 schematically illustrates a conventional voltage-controlled quartz oscillator. This oscillator includes a phase shifter 10 controlled by a voltage $V_\phi$ and including differential inputs V+ and V− for receiving a differential voltage to be phase shifted. A reverse feedback loop includes a resistor 12 connected between the output Vo of phase shifter 10 and its inverting input V−. Quartz X is connected between inverting input V− and a supply potential, for example the low supply potential Vee. A feedback loop includes a resistor 13, of the same value as resistor 12, connected between output Vo and non-inverting input V+. A capacitor C is connected between non-inverting input V+ and potential Vee. Capacitor C is meant to compensate the effects of a parallel stray capacitance of quartz X and its value is chosen to be substantially equal to the value of the parallel stray capacitance.

For the circuit of FIG. 1 to oscillate, the voltage gain of phase shifter 10 must be greater than one. Then, if the phase shift is zero, the circuit oscillates at the fundamental frequency of quartz X. By imposing a non zero phase shift, quartz X is forced to oscillate at a value which is different from its fundamental frequency. The frequency setting range is limited to about ±0.025% from the fundamental frequency, which is appropriate for some applications.

FIG. 2 shows a conventional voltage-controlled phase shifter, such as that described in Valvo Berichte, volume XVIII, part ½, 1988, pages 18–20.

This phase shifter includes two differential stages which respectively include a pair of transistors Q1, Q2, and a pair of transistors Q3, Q4. The bases of transistors Q1 and Q4 receive a first differential component of phase control voltage $V_\phi$, while the bases of transistors Q2 and Q3 receive the second component of control voltage $V_\phi$. The collector of transistor Q1 is connected to a high supply potential Vcc by two resistors 15 and 16 connected in series, and the collector of transistor Q2 is connected to potential Vcc by two resistors 17 and 18 connected in series. The collector of transistor Q3 is connected to the connection node of resistors 15 and 16, while the collector of transistor Q4 is connected to the connection node of resistors 17 and 18. Further, the collectors of transistors Q1 and Q2 are connected to each other by a resistor 19 and a capacitor 20 connected in series. Output voltage Vo of the phase shifter is taken at the connection node between resistor 19 and capacitor 20.

Differential stages Q1/Q2 and Q3/Q4 are respectively biased by the two output branches of an additional differential stage including a pair of transistors Q5, Q6. The collector of transistor Q5 is connected to the emitters of transistors Q1 and Q2, while the collector of transistor Q6 is connected to the emitters of transistors Q3 and Q4. Differential stage Q5/Q6 is biased by a current source 22 connected between low supply potential Vee and the emitters of transistors Q5 and Q6. The bases of transistors Q5 and Q6 respectively form the inverting input V− and the non-inverting input V+ of the phase shifter.

The operation of this phase shifter is described in above-mentioned Valvo Berichte document.

A disadvantage of this phase shifter is that its gain varies in large amounts according to the phase shift and reaches a minimum value close to one for a zero phase shift. This minimum value can become lower than one when the operating conditions vary or by the dispersion of the values of the components with respect to the desired values, whereby the oscillator stops.

Another disadvantage of this phase shifter is that the variation range of output voltage Vo is reduced, due to the presence of a significant number of stages between the node where voltage Vo is taken and low supply potential Vee. There is thus a significant probability that voltage Vo reaches its clipping limits when the gain of the phase shifter moves away from its minimum value, especially if the supply voltage is low. The use of such a phase shifter is thus impractical if it is desired to generate sinusoidal signals.

If the voltage gain of the phase shifter is decreased to limit clipping risks, the minimum gain is also decreased, thus increasing the risk of stopping the oscillator.

Still another disadvantage of the phase shifter of FIG. 2 is that the variation of the phase shift according to control voltage $V_\phi$ is not symmetrical. This phase shift decreases from 90° and asymptotically tends to −30°. Such a asymmetry disturbs the behavior of a reverse feedback loop.

SUMMARY OF THE INVENTION

An object of the present invention is to provide a voltage-controlled phase shifter avoiding all these disadvantages.

To achieve this and other objects, the present invention provides a voltage-controlled phase shifter including two differential stages controlled in phase opposition by a differential phase control voltage, and each including a biasing branch and first and second output branches respectively coupled with the first and second output branches of the other stage; two first resistors respectively coupling the first and second output branches to a first supply potential; a first capacitor connected between the first and second output branches; two second resistors connected in series between the biasing branches of the differential stages; a second capacitor connected in series between the two second resistors; means for applying an input signal in the form of a differential current across the second capacitor; and means for supplying, as a component of an output signal, the sum of the current in one of the first resistors and of a predetermined fraction of a corresponding component of the differential current constituting the input signal.

According to an embodiment of the present invention, the differential current constituting the input signal is provided by the two output branches of a third differential stage, the predetermined fraction being supplied by a corresponding output branch of a fourth differential stage controlled and biased in the same way as the third differential stage.

According to an embodiment of the present invention, the currents of the output branches of the fourth differential stage and the currents in the first resistors are combined by current mirrors to form a single output current.

According to an embodiment of the present invention, the first resistors are incorporated in corresponding current mirrors to improve the accuracy of the mirrors.

The present invention also relates to a voltage-controlled quartz oscillator including, in a control loop, a phase shifter according to the present invention, followed by a current-voltage converter, the third and fourth differential stages of the phase shifter being controlled by a feedback voltage and a reverse feedback voltage supplied from the output voltage of the current-voltage converter.

According to an embodiment of the present invention, the gain of the current-voltage converter is set according to the rectified value of the difference of the feedback and reverse feedback voltages.

According to an embodiment of the present invention, the current-voltage converter includes a multiplier with two differential stages controlled by the rectified value, the output current of the phase shifter being injected at the level of the biasing branch of one of the differential stages of the multiplier.

The foregoing objects, features and advantages of the present invention, will be discussed in detail in the following non-limiting description of specific embodiments, in connection with the accompanying drawings.

DETAILED DESCRIPTION

Figure 2:
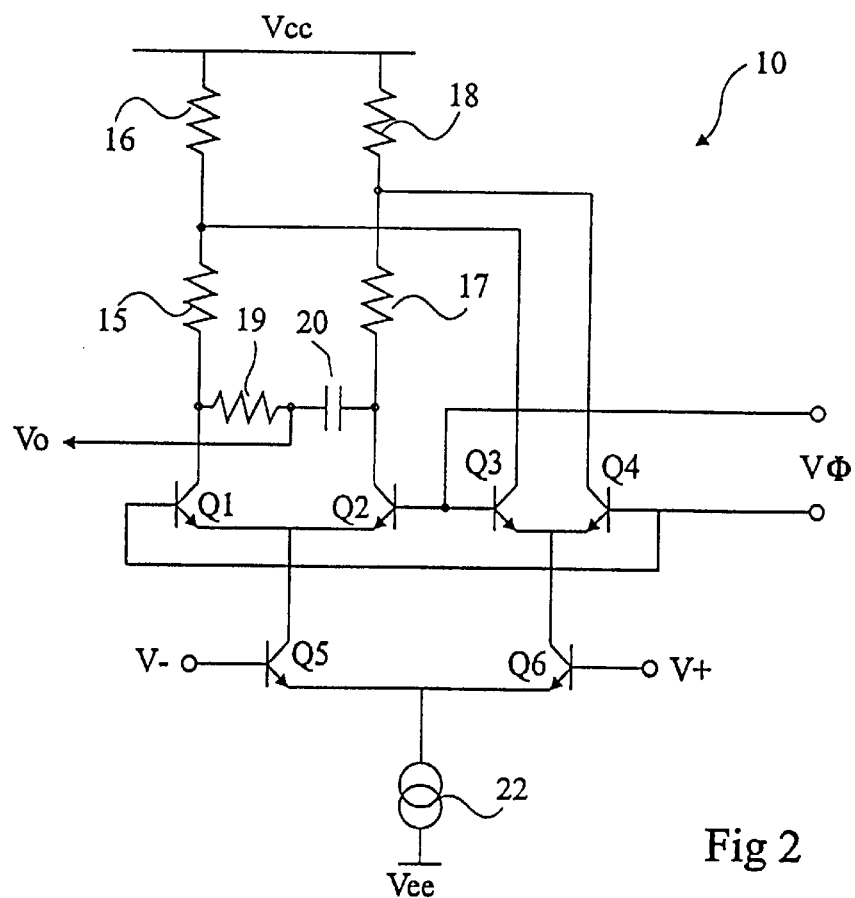
FIG. 2, previously described, shows a conventional voltage-controlled phase shifter.
Figure 3:
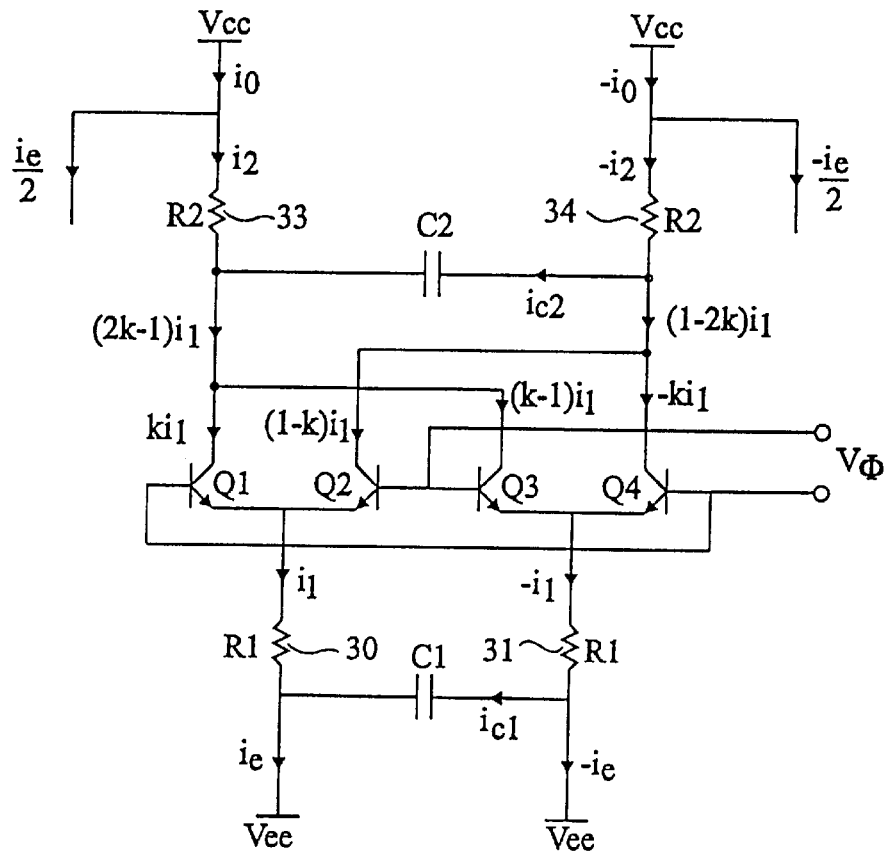
FIG. 3 shows an embodiment of voltage-controlled phase shifter according to the present invention.

In FIG. 3, a voltage-controlled phase shifter according to the present invention includes, like the conventional phase shifter of FIG. 2, two differential stages formed of a pair of transistors Q1, Q2, and of a pair of transistors Q3, Q4. The emitters of transistors Q1 and Q2 are connected to a first terminal of a resistor 30, while the emitters of transistors Q3 and Q4 are connected to a first terminal of a resistor 31 of same value R1 as resistor 30. The second terminals of resistors 30 and 31 are connected to each other via a capacitor C1 and are coupled to a first supply potential, for example low potential Vee, to receive currents $i_e$ and $-i_e$.

The collectors of transistors Q1 and Q3 are connected to a same terminal of a resistor 33, while the collectors of transistors Q2 and Q4 are connected to a same terminal of a resistor 34 of same value R2 as resistor 33. Resistors 33 and 34 are further coupled with a second supply potential, for example high potential Vcc. A capacitor C2 is connected between the collectors of transistors Q1 and Q4 (or Q3 and Q2).

Stages Q1/Q2 and Q3/Q4 are controlled in phase opposition by differential phase control voltage $V_\phi$, that is, the bases of transistors Q1 and Q4 receive a first component of this voltage $V_\phi$ and the bases of transistors Q2 and Q3 receive the second component.

A phase shifter according to the present invention, conversely to the conventional phase shifter of FIG. 2, operates in current mode. That is, the input and output signals of the phase shifter of FIG. 3 are currents. In the embodiment of FIG. 3, the input and output currents are differential currents. Components $i_e$ and $-i_e$ of the differential input current are respectively drawn from the terminals of capacitor C1 to potential Vee, and components $i_o$ and $-i_o$ of the output differential current are drawn from resistors 33 and 34, respectively.

The different currents i illustrated in the branches of the phase shifter are a.c. components expressed with respect to fixed quiescent currents.

To complete the phase shifter according to the present invention, fractions of input components $i_e$ and $-i_e$, for example, $i_e/2$ and $-i_e/2$, are superposed to currents $i_2$ and $-i_2$ in resistors 33 and 34 to form output components $i_o$ and $-i_o$.

The fact of operating in current mode enables setting of the variation range of the output currents independently from the number of stages which issue these currents. The variation range of the current in a branch is determined by the quiescent current of the branch. It is always possible to choose a sufficiently high value of the quiescent currents for the components of the output current never to reach the clipping limits, whatever the gain of the phase shifter. Any risk of distortion by clipping of the output signal is thus reduced or eliminated.

The voltage gain of the phase shifter can be freely chosen by the selection of a current-voltage converter issuing input signals $i_e$, $-i_e$, and by a current-voltage converter issuing an output voltage based on currents $i_o$ and $-i_o$. Examples of such converters will be described subsequently.

Figure 4:
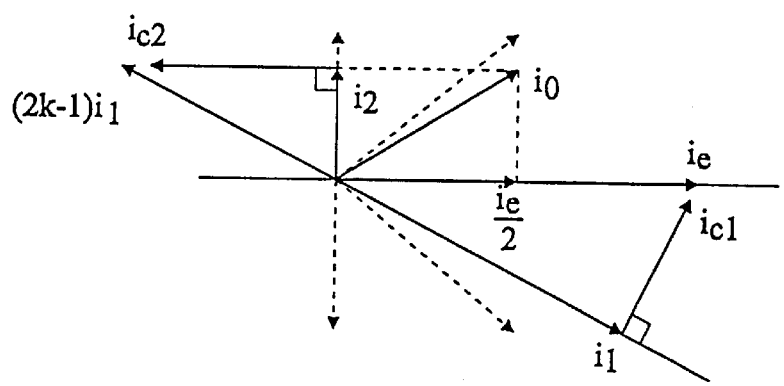
FIG. 4 shows a vectorial diagram illustrating the operation of the phase shifter of FIG. 3.

FIG. 4 shows a vectorial diagram illustrating the operation of the phase shifter of FIG. 3. The vectors are shown for a single component of the differential currents. Current $i_e$ is equal to the sum of current $i_{C1}$ in capacitor C1 and of current $i_1$ in resistor 30. Currents $i_1$ and $i_{C1}$ are in phase quadrature, and the corresponding vectors are thus perpendicular. Current $i_1$ is distributed between transistors Q1 and Q2 according to control voltage $V_\phi$. For example, the current in transistor Q1 has a value $ki_1$, where k varies between 0 and 1 according to voltage $V_\phi$. This results in a current $(1-k)i_1$ in transistor Q2 and a current $(k-1)i_1$ in transistor Q3. Thus, a current $(2k-1)i_1$, strictly in phase (neglecting the sign) with current $i_1$, is drawn from resistor 33 and from capacitor C2. In the example of FIG. 4, k is lower than ½, whereby current $(2k-1)i_1$ is of a sign opposite to that of current $i_1$. Current $(2k-1)i_1$ is equal to the sum of current $i_2$ in resistor 33 and of current $i_C2$ in capacitor C2. Currents $i_2$ and $i_C2$ are in phase quadrature.

When k varies from 0 to 1 as a function of voltage $V_\phi$, vector $(2k-1)i_1$ varies colinearly to itself from vector $-i_1$ to vector $i_1$, and vector $i_2$ varies colinearly to itself on either side of the axis of vector $i_e$, as shown in dotted lines.

The final output current $i_o$ is equal to the sum of current $i_2$ and of current $i_e/2$ which is in phase with input current $i_e$. Thus, as shown in dotted lines, vector $i_o$ varies between two limiting values on either side of vector $i_e$, transiting through vector $i_e/2$. In other words, the angle between vector $i_o$ and vector $i_e$ (and thus the phase shift of current $i_o$ with respect to current $i_e$) varies between a positive value and a negative value which both depend on the maximum amplitude of vector $i_2$, on the angle between vector $i_2$ and vector $i_e$ and on the constant amplitude selected for vector $(i_e/2)$ added to vector $i_2$.

By adequately choosing values R1, R2, C1, and C2 according to the operating frequency of the phase shifter, a current $i_2$ is obtained which is always in phase quadrature with current $i_e$ and the phase shift varies symmetrically. If values R1, R2, C1, and C2 are further chosen so that the phase shifts between currents $i_1$ and $i_e$ and between currents $-i_1$ and $i_2$ are equal to 45°, the phase shift of current $i_o$ with respect to current $i_e$ varies between −45 and +45° (this, with value $i_e/2$ for the current which is added to current $i_2$).

The amplitude of current $i_o$ varies from a minimum value $i_e/2$ for a zero phase shift to a maximum value $i_e\sqrt{2}/2$ for a phase shift of ±45°. In this case, the gain of the phase shifter varies by only 3 dB.

Figure 5:
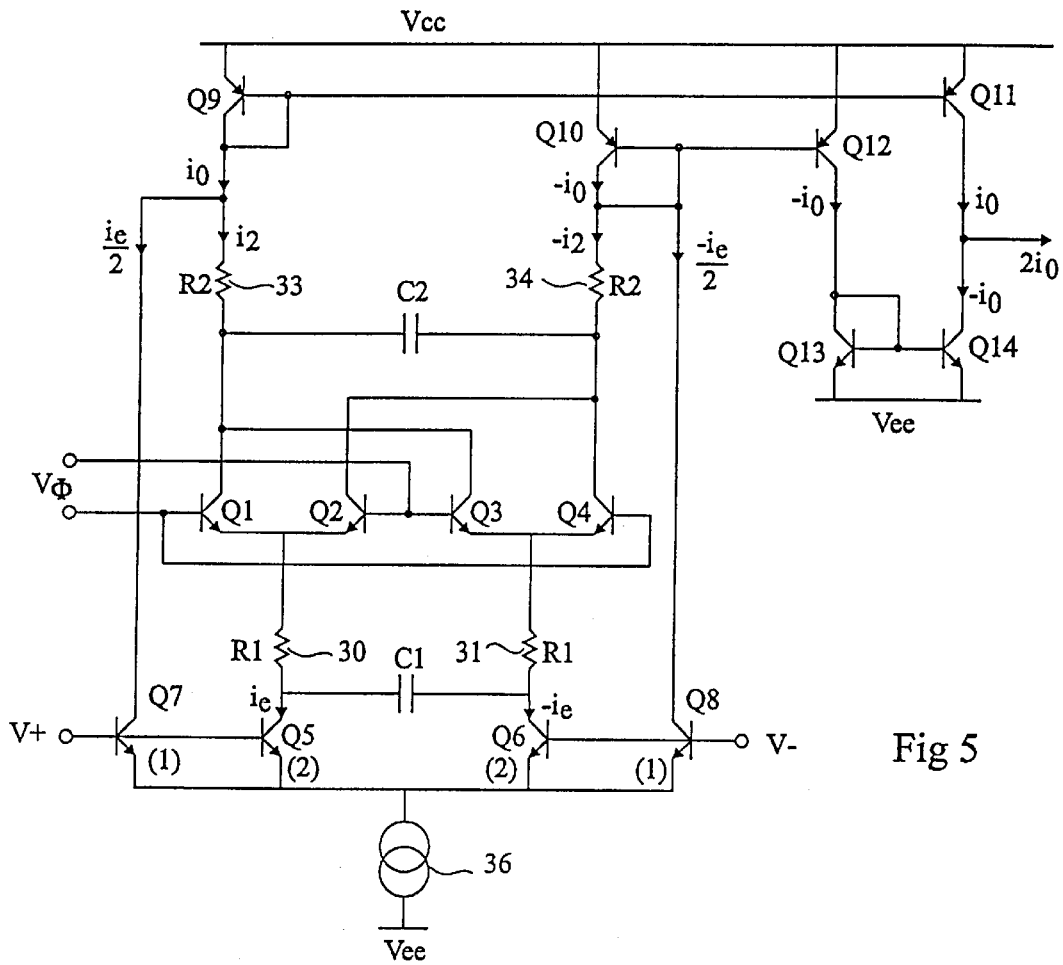
FIG. 5 shows a complete embodiment of a phase shifter according to the present invention.

FIG. 5 illustrates the phase shifter of FIG. 3 completed with elements enabling to exploit this phase shifter with a differential input voltage and to supply an output current on a node, the potential of which can vary in a wide range.

Components $i_e$ and $-i_e$ of the differential input current are respectively supplied by the collectors of two transistors Q5 and Q6 mounted as a differential stage. The emitters of transistors Q5 and Q6 are coupled to potential Vee by a current source 36. Current fractions $i_e/2$ and $-i_e/2$ are respectively issued by the collectors of two transistors Q7 and Q8 which are connected in parallel by their bases and their emitters to transistors Q5 and Q6, respectively. The bases of transistors Q5 and Q7 form the non-inverting input V+ of the phase shifter, while the bases of transistors Q6 and Q8 form the inverting input V− of the phase shifter. Inputs V+ and V− are voltage-controlled.

The emitter surface areas of transistors Q5 to Q8 are selected to obtain the desired ratio between currents $i_e$, $-i_e$, and $i_e/2$, $-i_e/2$. Thus, to obtain a ratio of 2, the emitter surface areas of transistors Q5 and Q6 are twice as large as those of transistors Q7 and Q8, as illustrated by numbers in brackets in FIG. 5.

Current source 36 sets the quiescent currents in the different branches of the phase shifter, and thus determines the variation range of these currents. If current source 36 generates a current 6I, the quiescent current in each of transistors Q1 to Q4, Q7, and Q8 is set to value I, in the example of FIGS. 3 and 5. This means that current $i_e/2$ can vary between −I and +I and that current $i_2$ can vary between −2I and +2I, and thus that current $i_o$ can vary between −3I and +3I.

Resistors 33 and 34 are coupled to potential Vcc by respective transistors Q9 and Q10 forming the inputs of two current mirrors. The first current mirror includes transistor Q9 and a transistor Q11 connected in parallel by its base and its emitter to transistor Q9. The second current mirror includes transistor Q10 and a transistor Q12 connected in parallel by its base and its emitter to transistor Q10. The emitters of transistors Q9 to Q12 are connected to potential Vcc. The base and collector of transistor Q9 are connected to resistor 33, while the base and collector of transistor Q10 are connected to resistor 34.

The collectors of transistors Q11 and Q12 are connected respectively to the output and to the input of a current mirror formed of two transistors Q13 and Q14. The emitters of transistors Q13 and Q14 are connected to low potential Vee. The collector of transistor Q12 is connected to the collector and to the base of transistor Q13 and to the base of transistor Q14. The collectors of transistors Q11 and Q14, connected to each other, provide the output current of the phase shifter. Currents $i_o$ and $-i_o$ are copied on the collectors of transistors Q11 and Q12 while the collector current $-i_o$ of transistor Q13 is copied on the collector of transistor Q14. Current $2i_o$ necessary to balance the collector currents of transistors Q11 to Q14 constitutes the output current.

Figure 6:
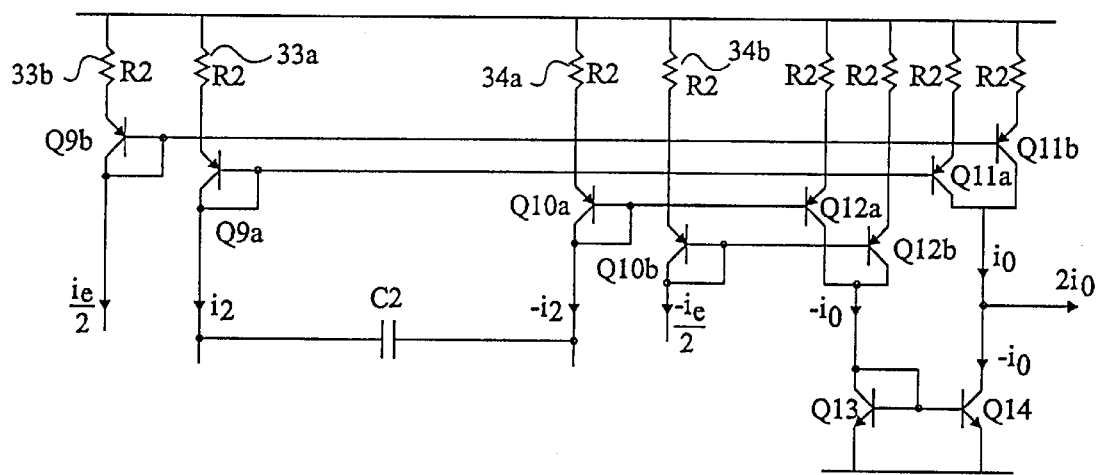
FIG. 6 shows an alternative of a portion of the phase shifter of FIG. 5.

FIG. 6 illustrates an alternative embodiment of the current mirrors formed by transistors Q9 to Q12 of FIG. 5. It is generally preferred to use emitter resistors for the transistors of a current mirror, which improves the copying accuracy of the mirror.

The alternative embodiment of FIG. 6 enables keeping the behavior of FIG. 4, while using emitter resistors for the transistors of the current mirrors. The two current mirrors formed by transistors Q9 to Q12 in FIG. 5 are duplicated in FIG. 6 to form four current mirrors formed of transistors Q9a, Q9b to Q12a, Q12b. Each of the emitters of these transistors is connected to potential Vcc by a respective resistor of value R2. Resistors 33 and 34 are eliminated, their function being performed by resistors 33a and 33b respectively located at the emitters of transistors Q9a and Q9b, and by resistors 34a and 34b respectively located at the emitters of transistors Q10a and Q10b. The collectors of transistors Q9a and Q10a are directly connected to the respective terminals of capacitor C2, while the collectors of transistors Q9b and Q10b respectively receive current fractions $i_e/2$ and $-i_e/2$ from the collectors of transistors Q7 and Q8.

The collectors of transistors Q11a and Q11b are connected to the collector of transistor Q14, while the collectors of transistors Q12a and Q12b are connected to the collector of transistor Q13. With this configuration, currents $i_o$ and $-i_o$ are generated for the first time at the collectors of transistors Q11a and Q11b and of transistors Q12a and Q12b.

Figure 1:
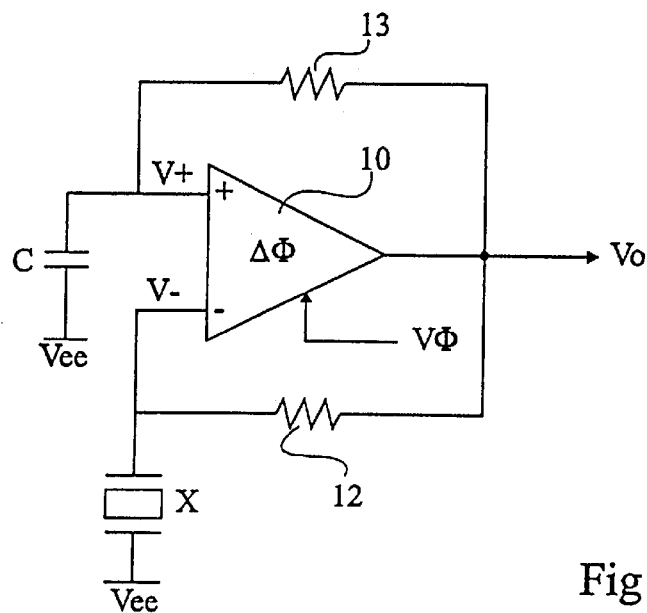
FIG. 1, previously described, shows a conventional voltage-controlled quartz oscillator.
Figure 7:
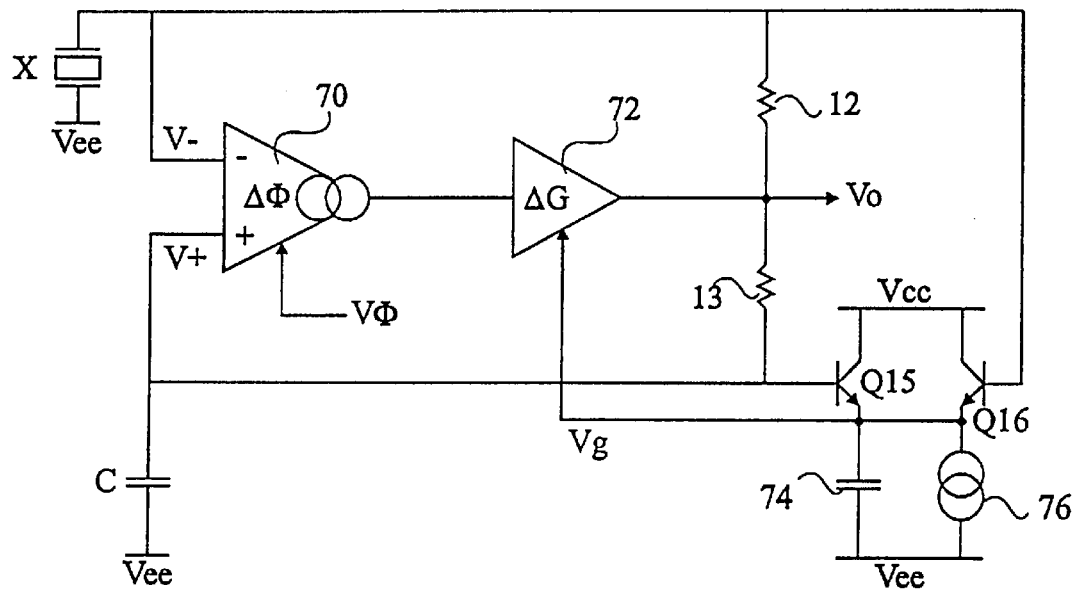
FIG. 7 shows an embodiment of a voltage-controlled quartz oscillator according to the present invention.

FIG. 7 illustrates an embodiment of a voltage-controlled quartz oscillator wherein a phase shifter 70 according to the present invention is used. This oscillator is identical to that of FIG. 1, except that phase shift amplifier 10 has been replaced with a phase shifter 70 according to the present invention followed by a current-voltage converter 72.

As indicated previously, in the example where the extreme phase shifts of the phase shifter according to the present invention are set to ±45°, the gain of the phase shifter varies at most by 3 dB over the entire variation range of the phase shift. The general voltage gain can be set independently from the phase shift by setting the conversion ratio of current-to-voltage converter 72. This converter 72 can be merely formed by a resistor connected between the output of phase shifter 70 and a reference potential, followed by a follower transistor. The voltage gain is then chosen by setting the value of this resistance. The gain may be chosen so that the minimum voltage gain is always clearly higher than one in order to guarantee the oscillation.

As mentioned previously, the clipping limits of the currents are determined by the biasing current issued by source 36. This biasing current can be chosen without restrictions (except as to concerns of circuit power consumption). Output voltage Vo can, with the circuits of FIGS. 5 and 6, practically reach supply potentials Vcc and Vee.

In order to generate a sinusoidal output voltage Vo with a constant amplitude and a low distortion, current-to-voltage converter 72 has a variable gain. The gain is controlled by a voltage $V_G$ which corresponds to the rectified value of the differential input voltage of phase shifter 70. For this purpose, for example, two transistors Q15 and Q16 respectively receiving on their bases voltages V+ and V−, are provided. The collectors of transistors Q15 and Q16 are connected to high potential Vcc and control voltage $V_G$ is taken from the emitters of these transistors.

A capacitor 74 connected between the emitters of transistors Q15 and Q16 and a fixed potential, for example Vee, stores the rectified value of the differential input voltage of the phase shifter (increased with a possible d.c. component). A current source 76 ensures the discharge of capacitor 74 when the rectified value decreases. The gain of converter 72 varies inversely to the variation of control voltage $V_G$ in order to cause a gain decrease when the amplitude of voltage V+ and V− becomes too high.

Figure 8:
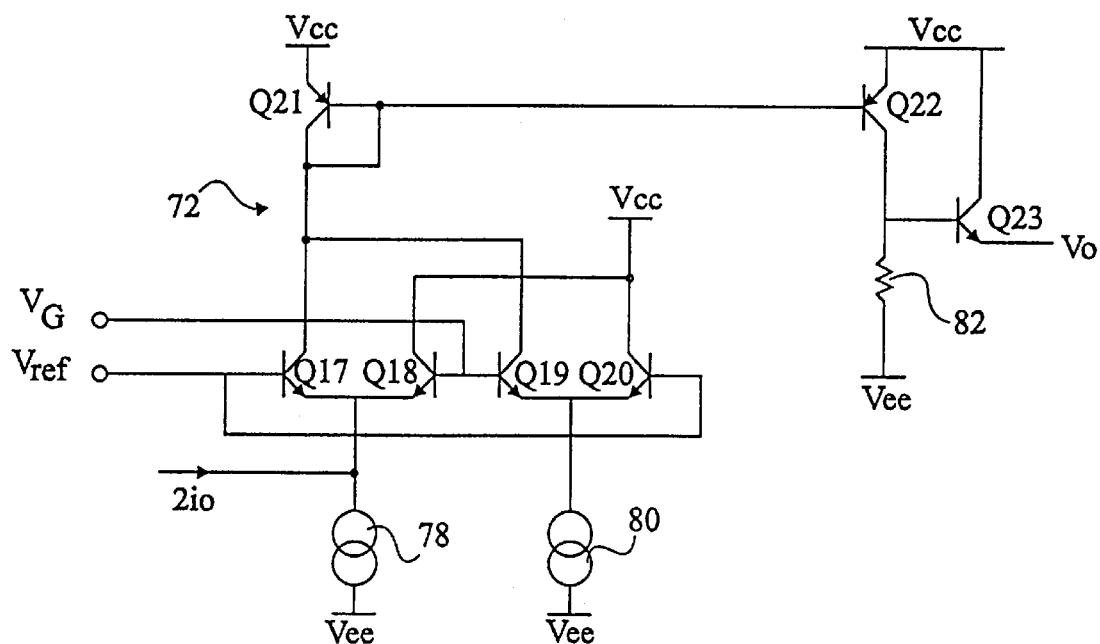
FIG. 8 shows an example of a variable gain amplifier which can be used in the oscillator of FIG. 7.

FIG. 8 shows an example of an embodiment of a variable gain current-to-voltage converter 72. This converter is constituted by a Gilbert multiplier including two differential stages connected in parallel by their output branches and controlled in phase opposition by a differential voltage having as components control voltage $V_G$ and a reference voltage $V_{ref}$. A first stage is formed of a pair of transistors Q17, Q18, and the second one is formed of a pair of transistors Q19 and Q20. The emitters of transistors Q17 and Q18 are coupled to potential Vee by a current source 78, while the emitters of transistors Q19 and Q20 are coupled to potential Vee by a current source 80.

Output current $2i_o$ of the phase shifter is added to the current of source 78.

The cumulated current of the collectors of transistors Q17 and Q19 is copied into a resistor 82 by a current mirror formed of transistors Q21 and Q22. A follower transistor Q23 takes the voltage across resistor 82 and provides it as an output voltage Vo.

With such a controlled-gain converter 72, the open loop gain of the system is maintained at 1, while ensuring an oscillation. The unity gain enables to avoid the clipping of signal Vo, and thus to keep it sinusoidal. The amplitude of signal Vo is set by reference voltage Vref, and it can practically reach the value of the unclipped supply voltage.

In the quiescent state, that is, for a zero differential voltage at the input of phase shifter 70, converter 72 normally provides a zero phase shift. However, the inevitable presence of stray capacitances and resistances causes a non zero phase shift in the quiescent state. Compensating such a parasitic phase shift is particularly simple in a phase shifter according to the present invention. It is enough to unbalance the differential stages of the phase shifter, for example, by applying a continuous offset voltage on its input.

In the circuits which have been described hereabove, the variations of control voltages $V_\phi$ and $V_G$ cause exponential current variations. If it is desired to generate linear current variations as a function of control voltages $V_\phi$ and $V_G$, linearization stages well known in the art ("translinear" loops) will be used.

For simplification, the embodiments have been shown with current mirrors of simple structure. Of course, higher performance conventional structures can be chosen for these current mirrors.

The present invention is likely to have various alterations, modifications, and improvements which will readily occur to those skilled in the art. For example, if a variation of the phase shift between limits other than ±45° are desired, these limits may be adjusted by selecting a fraction other than $i_e/2$ to be added to current $i_2$, or else by modifying the maximum value of current $i_2$ by the choice of values R1, R2, C1, and C2. In this latter case, if symmetrical phase shift limits are desired to be obtained, attention will be paid to choosing the values so that current $i_2$ is in phase quadrature with current $i_e$.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A voltage-controlled phase shifter, including:
   two differential stages controlled in phase opposition by a differential phase control voltage, and each differential stage including a biasing branch and first and second output branches, where the first and second output branches of one differential stage are respectively coupled with the first and second output branches of the other differential stage;
   two first resistors respectively coupling the first and second output branches to a first supply potential;
   a first capacitor connected between the first and second output branches;
   two second resistors connected in series between the biasing branches of the differential stages;
   a second capacitor connected in series between the two second resistors;
   means for applying an input signal in the form of a differential current across the second capacitor, the differential current having a component that corresponds to a current in one of the first resistors; and
   means for supplying a component of a differential output signal, the component comprising the sum of the current in the one of the first resistors and of a predetermined fraction of the corresponding component of the differential current.

2. A phase shifter according to claim 1, wherein the differential current constituting the input signal is provided by the two output branches of a third differential stage, the predetermined fraction being supplied by a corresponding output branch of a fourth differential stage controlled and biased in the same way as the third differential stage.

3. A phase shifter according to claim 2, wherein the currents of the output branches of the fourth differential stage and the currents in the first resistors are combined by current mirrors to form a single output current.

4. A phase shifter according to claim 3, wherein the first resistors are incorporated in corresponding current mirrors to improve the accuracy of the mirrors.

5. A voltage-controlled quartz oscillator including, in a control loop, a phase shifter according to claim 2, followed by a current-voltage converter, the third and fourth differential stages of the phase shifter being controlled by a feedback voltage and a reverse feedback voltage supplied from the output voltage of the current-voltage converter.

6. An oscillator according to claim 5, wherein the gain of the current-voltage converter is set according to the rectified value of the difference of the feedback and reverse feedback voltages.

7. An oscillator shifter according to claim 6, wherein the current-voltage converter includes a multiplier with two differential stages controlled by the rectified value, the output current of the phase shifter being injected at the level of the biasing branch of one of the differential stages of the multiplier.

8. A phase shifter according to claim 1 wherein said means for applying an input signal includes a third differential stage including a pair of transistors of like conductivity type.

9. A phase shifter according to claim 8 further including a fourth differential stage also including a pair of transistors of like conductivity type.

10. A phase shifter according to claim 9 wherein the transistors of the third and fourth differential stages are all of the same conductivity type.

11. A phase shifter according to claim 10 including a common current source for the third and fourth differential stages.

12. A phase shifter according to claim 8 wherein said means for supplying includes a pair of transistors forming the inputs of two respective current mirror circuits.

13. A phase shifter according to claim 12 wherein said first current mirror circuit includes one of said transistors and a further transistor that is connected in parallel by its base and its emitter to said one transistor.

14. A phase shifter according to claim 13 wherein said second current mirror circuit includes the other of said transistors and an additional transistor connected in parallel by its base and its emitter to said other transistor.

15. A phase shifter according to claim 14 including a third current mirror circuit coupled from said first and second current mirror circuits.

16. A phase shifter according to claim 15 wherein said third current mirror circuit includes two transistors having at the collector of one thereof the single output current.

17. A phase shifter according to claim 8 wherein said means for supplying includes current mirror means.

18. A phase shifter according to claim 17 wherein each current mirror means comprises a pair of transistors.

19. A phase shifter according to claim 18 wherein each current mirror means comprises two pairs of transistors.

20. A voltage-controlled phase shifter comprising:
two differential stages controlled in phase opposition by a differential phase control voltage, and each including a biasing branch and first and second output branches;
a first supply potential;
two first resistors respectively coupling the first and second output branches to the first supply potential;
a first capacitor coupled between the first and second output branches;
two second resistors coupled to the biasing branches of the respective differential stages;
a second capacitor coupled between the two second resistors;
a first circuit for applying an input signal across the second capacitor;
and a second circuit for supplying, as a component of an output signal, the sum of the current in one of the first resistors and of a predetermined fraction of a corresponding component of the differential current constituting the input signal.

21. A phase shifter according to claim 20 wherein said first circuit includes a third differential stage including a pair of transistors of like conductivity type.

22. A phase shifter according to claim 21 further including a fourth differential stage also including a pair of transistors of like conductivity type.

23. A phase shifter according to claim 22 wherein the transistors of the third and fourth differential stages are all of the same conductivity type.

24. A phase shifter according to claim 23 including a common current source for the third and fourth differential stages.

25. A phase shifter according to claim 20 wherein said second circuit includes a pair of transistors forming the input of two respective current mirror circuits.

26. A phase shifter according to claim 25 wherein said first current mirror circuit includes one of said transistors and a further transistor that is connected in parallel by its base and its emitter to said one transistor.

27. A phase shifter according to claim 26 wherein said second current mirror circuit includes the other of said transistors and an additional transistor connected in parallel by its base and its emitter to said other transistor.

28. A phase shifter according to claim 27 including a third current mirror circuit coupled from said first and second current mirror circuits.

29. A phase shifter according to claim 28 wherein said third current mirror circuit includes two transistors having at the collector of one thereof the single output current.

30. A phase shifter according to claim 20 wherein said second circuit includes a current mirror circuit.

31. A phase shifter according to claim 30 wherein each current mirror circuit comprises a pair of transistors.

32. A phase shifter according to claim 31 wherein each current mirror circuit comprises two pairs of transistors.

* * * * *